Sept. 22, 1970 J. R. RAIRDEN III 3,529,350

THIN FILM RESISTOR-CONDUCTOR SYSTEM EMPLOYING β-TUNGSTEN RESISTOR FILMS

Filed Dec. 9, 1968 2 Sheets-Sheet 1

Inventor:
John R. Rairden,
by John J. Kissane
His Attorney.

Inventor:
John R. Rairden,
by John J. Kissane
His Attorney.

United States Patent Office 3,529,350

Patented Sept. 22, 1970

3,529,350
THIN FILM RESISTOR-CONDUCTOR SYSTEM EMPLOYING β-TUNGSTEN RESISTOR FILMS

John R. Rairden III, Niskayuna, N.Y., assignor to General Electric Company, a corporation of New York Continuation-in-part of applications Ser. No. 675,990, Oct. 17, 1967, and Ser. No. 738,563, June 20, 1968. This application Dec. 9, 1968, Ser. No. 782,232

Int. Cl. H05k 3/06, 3/30

U.S. Cl. 29—626 11 Claims

ABSTRACT OF THE DISCLOSURE

A resistor-conductor system suitable for hybrid microcircuits is formed by the sequential deposition of a β-tungsten resistor film and a metallic film or aluminum, copper, gold, tin or nickel atop a dielectric substrate. Preferably a β-tungsten resistor film is formed by reactive evaporation of tungsten in low pressure, e.g. $5\times10^{-4}$ torr, atmosphere of oxygen, nitrogen, ammonia, methane or argon while the metallic film can be formed by any conventional film forming technique such as vacuum evaporation or plating. Subsequent to the depositions, the metallic film is photoetched, e.g. employing a ferric chloride solution for copper, nickel, and tin films, whereupon the exposed β-tungsten film is subsequently etched with hydrogen peroxide. A semiconductor chip then can be secured to the resistor-conductor network by ultrasonic bonding for aluminum films or by solder reflow techniques for solderable metallic films.

THE DISCLOSURE

This invention relates to resistor-conductor systems employing β-tungsten resistor films and to a method of forming such systems by a selective etch procedure. This application is a continuation in part of my U.S. applications Ser. No. 675,990 and 738,563, filed Oct. 17, 1967 and June 20, 1968 respectively.

Thin film resistor-conductor laminar structures, e.g. gold coated nickel conductors deposited atop chromium resistors, have been employed in the fabrication of hybrid microelectronic circuits by the selective etching of the individual resistor and conductor films to a desired configuration, or system, suitable for the circuitry. The conductor and resistor films forming the laminar structure however must be chemically compatible with the etchants employed to permit the sequential selective etching of the layers into diverse configurations. Thus, the resistor film and the conductor film must be of materials susceptible of individual etching and the etchants employed to form the desired resistor and conductor configurations must be selective in the dissolution of the films.

It is therefore an object of this invention to provide a novel resistor-conductor system employing β-tungsten resistors.

It is also an object of this invention to provide an inexpensive hybrid circuit employing a β-tungsten resistor film.

It is a still further object of this invention to provide a method of forming a β-tungsten-conductor system for hybrid microelectronic purposes.

These and other objects of this invention generally are achieved employing a resistor-conductor network characterized by a dielectric substrate, a β-tungsten resistor film deposited atop the substrate and a metallic film selected from the group consisting of aluminum, copper, gold, tin, nickel, and combinations thereof overlying the β-tungsten resistor film. Both the resistor film and the metallic film are etched into diverse configuration atop the substrate compatible with components forming the remainder of the microelectronic circuit.

In forming a β-tungsten-conductor system according to this invention, tungsten is vaporized in an atmosphere of a gas selected from the group consisting of oxygen, nitrogen bearing gases, carbon bearing gases and inert gases, at a source to substrate–atmospheric pressure arithmetic product greater than $35.5\times10^{-4}$ torr centimeters and the β-tungsten resistor film is deposited atop a dielectric substrate. The substrate is then overlaid with a conductive film, e.g. aluminum, copper, gold, tin or nickel, and after a selective masking of the conductive film, the conductive film is etched into a plurality of conductive runs thereby exposing a portion of the underlying β-tungsten resistor film. The β-tungsten resistor film then is masked and selectively etched, e.g. with a hydrogen peroxide solution, into a predetermined pattern forming the β-tungsten-conductor system.

The novel features believed characteristic of the invention are set forth in the appended claims. The invention itself, together with further objects and advantages thereof may best be understood by reference to the following description, taken in connection with the accompanying drawings, in which:

Figure 1:
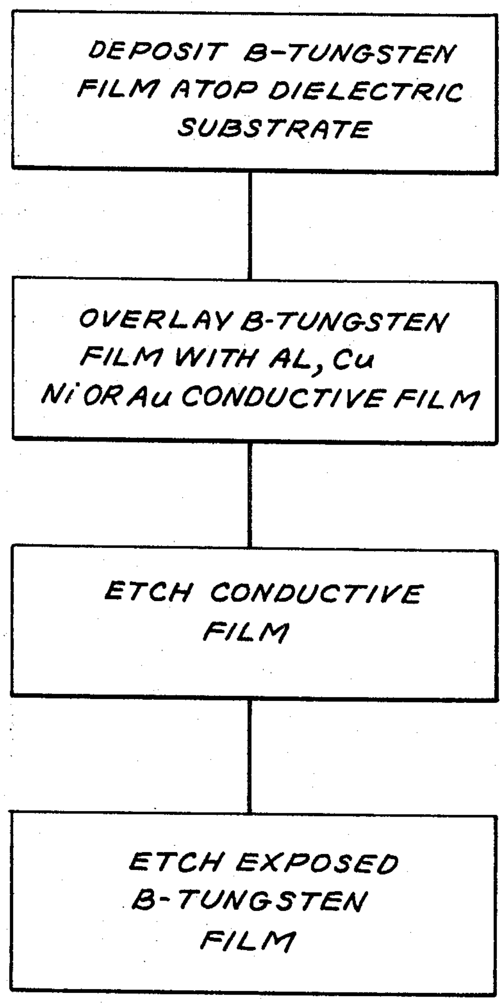
FIG. 1 is a block diagram depicting the technique employed in forming β-tungsten-conductor system in accordance with this invention.
Figure 2:
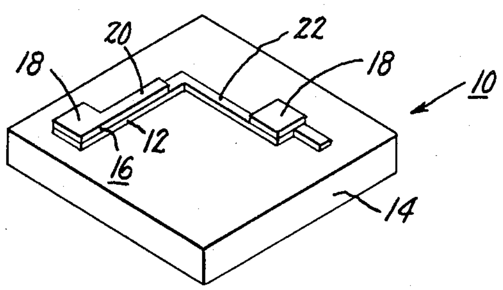
FIG. 2 is an isometric view of a β-tungsten-conductor system in accordance with this invention.

A method of forming a resistor-conductor system 10 in accordance with this invention is depicted in FIG. 1 and generally comprises depositing a β-tungsten resistor film 12 atop a dielectric substrate 14, overlaying the β-tungsten film with a conductive film 16 of aluminum, copper, nickel, tin or gold, and selectively etching the conductive film and the β-tungsten films into diverse configurations to produce the resistor-conductor system portrayed in FIG. 2.

β-tungsten resistor film 12 is deposited atop dielectric substrate 14 by techniques disclosed in my heretofore referred to copending U.S. applications Ser. No. 675,990, filed Oct. 17, 1967 and Ser. No. 738,563, filed June 20, 1968 (the disclosures of which applications are incorporated herein by reference) e.g. by reactively depositing tungsten in an atmosphere of a gas selected from the group consisting of oxygen, nitrogen bearing gases, carbon bearing gases and the inert gases at a source to substrate—atmospheric pressure arithmetic product greater than $35.5\times10^{-4}$ torr centimeters. The deposition preferably is conducted at a rate between 10 and 500 A. per minute and the dielectric substrate desirably is unheated for depositions performed in a nitrogen bearing gas, a carbon bearing gas, or an inert gas. For depositions in an oxygen atmosphere, a substrate temperature between 125° C. and 320° C. preferably is employed. In general, β-tungsten resistor film 12 is deposited to a thickness less than 1 micron for most hybrid circuit applications.

Because of the reduced substrate temperature employed during deposition of β-tungsten resistor film 12, substrate materials having a relatively low softening point can be employed. For example, substrate 14 can be formed of a glass such as soda lime glass, borosilicate glass or barium-alumina borosilicate glass; a polyester or polyamide coated metallic substrate; or a glass-epoxy laminated circuit board. Similarly refractory substrates also can serve as the dielectric substrate for the resistor-conductor system of this invention when a relatively high temperature, e.g., 400° C., bake is employed to stabilize the β-tungsten resistor film.

Subsequent to the formation of the β-tungsten resistor film atop the substrate, a metal conductive film such as aluminum, copper, nickel, gold, tin or combinations thereof is deposited atop the β-tungsten film by any suitable technique such as vacuum evaporation or sputtering. Because aluminum has the ability to form a low resistance contact with silicon and germanium and often forms the metallization on semiconductive chips, β-tungsten-aluminum systems provide a suitable surface for ultrasonic bonding of the chip to the etched resistor-conductor system. Aluminum however is not solderable, and therefore nickel, copper or gold is preferred as conductive film 16 when solder type connections to the resistor-conductor system are desired. Because copper conductive films tend to tarnish, a coating of a non-tarnishing metal, e.g., tin or gold, advantageously can be placed atop copper conductive films to assure a clean surface for a solder connection. In general, conductive film 16 is deposited to a thickness between approximately 300 A. and 1 mil to obtain a desired conductivity in the conductive runs subsequent to etching.

After the deposition of conductive film 16 atop β-tungsten resistor film 12, the conductive film is etched, e.g. by conventional photoetch techniques, into a predetermined configuration thereby forming a plurality of contacts and conductor runs, generally identified by reference numerals 18 and 20 respectively, atop the β-tungsten resistor film. Ferric chloride has been found to be a suitable etchant for copper, tin, and nickel conductive films permitting a dissolution of these metals without adversely effecting the underlying β-tungsten film while a solution of 75% phosphoric acid, 15% acetic acid, 5% nitric acid and 5% water is preferred for dissolution of an aluminum conductive film in the formation of a β-tungsten-aluminum system. A mixture of potassium iodide and free iodine generally is preferred for etching gold conductive films.

The etchant chosen to form the conductor runs must be compatible both with the β-tungsten resistor film and the chosen dielectric substrate. Thus desirably an etchant characterized by a minimum ratio of 10 to 1 between the etch rate of the conductive film and the etch rate either of the β-tungsten resistor film or of the dielectric substrate is required for forming the conductor runs. Such conductive film etchants as hydrofluoric acid and nitric acid therefore are unacceptable in forming conductor runs because of the rapid attack of these etchants upon ceramic and glass substrates.

Subsequent to the etching of conductive film 16 into a desired configuration thereby exposing a portion of the underlying β-tungsten resistor film, the β-tungsten film is photoetched employing a hydrogen peroxide etchant to form a plurality of resistor components 22 interconnected by conductor runs 20 thereby forming resistor-conductor system 10 of FIG. 2. In general, the concentration of the hydrogen peroxide solution employed for etching the β-tungsten film is not critical. A 10% sodium hydroxide solution can be employed to etch β-tungsten resistor films underlying nickel, copper or gold conductors although the violent attack of sodium hydroxide upon aluminum and certain commercial photoresists inhibits the employment of sodium hydroxide with these materials.

Figure 3:
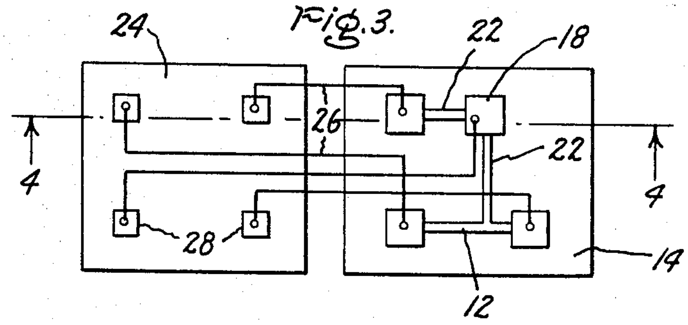
FIG. 3 is a plan view of a microelectronic circuit employing the β-tungsten-conductor system of this invention.
Figure 4:
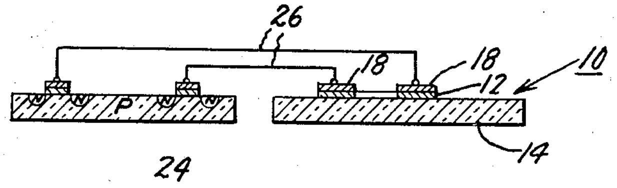
FIG. 4 is a sectional view taken along lines 4—4 of FIG. 3.

After resistor-conductor system 10 has been fabricated, the system can be connected in a hybrid circuit, such as is shown in FIGS. 3 and 4, by positioning a semiconductive chip 24, e.g. a silicon chip, in juxtaposition with the resistor-conductor system and employing a plurality of leads 26 to interconnect the contacts 28 of the semiconductor chip with contacts 18 of the resistor-conductor system utilizing joining techniques suitable for the materials forming the respective contacts. For example, a resistor-conductor system utilizing copper, tin or nickel contacts can be joined by conventional solder or thermal compression techniques while aluminum contacts on a resistor-conductor system generally require aluminum leads and ultrasonic bonding to effect a secure bond between leads 26 and contacts 18.

Figure 5:
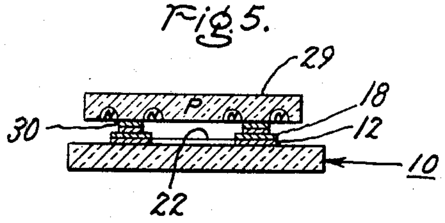
FIG. 5 is a sectional view of an alternate microelectronic circuit employing the β-tungsten-conductor system of this invention.

The resistor-conductor system of this invention is particularly adapted to the inverse mounting of semiconductor chips upon the system as depicted in FIG. 5. The underlying resistor-conductor system 10 preferably is formed of a β-tungsten resistor film 12 photoetched into a desired configuration employing a hydrogen peroxide etchant and an aluminum conductive layer photoetched with a mixture of 75% phosphoric acid, 15% acetic acid, 5% nitric acid and 5% water to provide a plurality of aluminum contacts 18. A silicon chip 29 having aluminum metalization runs thereon is positioned atop the resistor-conductor system with the aluminum contact pads 30 to the various type conductivity regions of the chip being in registration with the photoetched contacts 18 of the resistor-conductor system. Ultrasonic bonding then is employed to secure the silicon chip to the resistor-conductor system. Similarly, if the conductive film forming the resistor-conductor system of FIG. 4 is a solderable material, e.g. tin coated copper, a solder coating is plated upon the etched conductive contacts by dipping the flux coated system in a solder bath and a semiconductive chip having solderable contact pads is placed face down in registration with the solder coated conductive contacts of the resistor-conductor system. Upon a reflowing and cooling of the solder coating, the chip is electrically and mechanically secured to the resistor-conductor system.

A more complete understanding of the principles of this invention can be obtained from the following specific examples illustrating the formation of various β-tungsten-conductor systems.

Example 1

A β-tungsten resistor film was deposited atop a soda lime glass substrate by reactively evaporating a tungsten source in a vacuum chamber containing $8\times10^{-4}$ torr. nitrogen and depositing the evaporated source upon the unheated substrate situated within the chamber at a span approximately 14 inches from the source. The chamber then was evacuated to approximately $5\times10^{-5}$ torr. whereupon an aluminum source within the chamber was electron beam evaporated and deposited atop the β-tungsten resistor film. Upon removal of the β-tungsten-aluminum coated substrate from the vacuum chamber, the aluminum surface was photoetched to a predetermined configuration employing a mixture of 75% phosphoric acid, 15% acetic acid, 5% nitric acid and 5% water at a temperature of 50° C. No visible or electrically measurable etching was observed in the underlying β-tungsten film exposed by the selective etching of the aluminum. The exposed β-tungsten film then was selectively masked with photoresist and etched with hydrogen peroxide. No etching of the aluminum by the hydrogen peroxide was observed upon the subsequent removal of the photoresist from the surface of the β-tungsten-aluminum system.

Example 2

A 1000 A. thick β-tungsten resistor film was deposited upon a soda lime glass substrate by the technique of Example 1 whereupon a 3000 A. copper film and a 300 A. tin film were successively vacuum deposited atop the β-tungsten resistor film. The tin coated copper conductive film then was photoetched into a desired configuration employing a ferric chloride solution whereupon the exposed underlying β-tungsten film was coated with a suitable photoresist and photoetched using a hydrogen peroxide etchant to form a β-tungsten-copper-tin resistor-conductor system. Upon removal of the residual photoresist from atop the resistor-conductor system, the entire surface of the system was swabbed with solder flux whereupon the system was immersed for approximately 3 seconds in a lead-tin solder bath. Observation of the system upon removal from the bath indicated a solder coating only upon the conductive film with no solder coating the exposed β-tungsten film. Subsequent tests indicated no adverse effects upon the electrical properties of the exposed β-tungsten film resulting from immersion in the liquid solder.

Example 3

A β-tungsten resistor film was deposited atop an unheated soda lime glass slide by the technique of Example 2 whereupon an approximately 3000 A. nickel film was vacuum deposited atop the β-tungsten resistor film. The nickel coated β-tungsten film then was selectively masked with photoresist and etched with a ferric chloride solution to form conductor runs. The underlying β-tungsten film was not visibly affected by the ferric chloride etching of the nickel film. The exposed portion of the β-tungsten resistor film then was coated with photoresist, photoprocessed and etched employing a 30% hydrogen peroxide solution. Upon complete removal of the photoresist from atop the etched β-tungsten-nickel system, the entire system was coated with flux and dipped in lead-tin solder to coat only the nickel conductor. No discontinuities were observed in either the conductor or resistor runs forming the resistor-conductor system.

Example 4

A β-tungsten resistor film was formed as in Example 3 whereupon a 1000–2000 A. nickel film and an approximately 1000 A. gold film were sequentially vacuum deposited at approximately $10^{-5}$ torr upon the β-tungsten film. The gold and nickel films then were photoetched employing a mixture of potassium iodide and free iodine to selectively remove the conductors without adversely affecting the underlying β-tungsten resistor film. The exposed β-tungsten resistor film then was coated with photoresist and photoetched with hydrogen peroxide into a desired configuration. Gold films deposited upon nickel films less than 500 A. in thickness generally did not exhibit sufficient adherence to the substrate to function as a resistor-conductor system in accordance with this invention.

Example 5

A nickel coated β-tungsten resistor film was formed atop a glass substrate by the technique described in Example 4 whereupon an approximately 1000 A. gold film was electrodeposited atop the nickel employing an Orosene 999 solution (sold by Technic, Inc.) and a current density of 8 ma./cm.$^2$. The electroplated structure then was photoetched in a two step process employing a mixture of potassium iodide and free iodine for the conductive films and a hydrogen peroxide solution for the underlying β-tungsten resistor film. No etching either of the β-tungsten resistor film by the potassium iodide and free iodine mixture or of the conductive films by the hydrogen peroxide was observed.

What I claim as new and desire to secure by Letters Patent of the United States is:

1. A resistor-conductor system comprising a dielectric substrate, a β-tungsten resistor film deposited atop said substrate and a metallic film overlying said β-tungsten resistor film, said β-tungsten resistor film and said metallic film having diverse configurations atop said substrate.

2. A resistor-conductor system as in claim 1 wherein said metallic film is selected from the group consisting of aluminum, gold, copper, nickel, tin and mixtures thereof.

3. A resistor-conductor system according to claim 2 wherein said metallic film is copper and further including a layer of tin or gold deposited atop said conductor layer.

4. A resistor-conductor system according to claim 2 wherein said conductor is aluminum.

5. A resistor-conductor system according to claim 2 wherein said conductor is nickel and further including a gold layer deposited atop said nickel layer.

6. A method of forming a resistor-conductor system comprising vaporizing tungsten in an atmosphere of a gas selected from the group consisting of oxygen, nitrogen bearing gases, carbon bearing gases, and the inert gases at a source to substrate—pressure arithmetic product greater than $35.5 \times 10^{-4}$ torr cm., depositing said vaporized tungsten as a β-tungsten resistor film atop a dielectric substrate, overlying said β-tungsten resistor film with a conductive film selected from the group consisting of aluminum, gold, copper, nickel, and tin, masking and etching said conductive film into a predetermined pattern to expose a portion of said underlying β-tungsten film, masking said β-tungsten film and etching said β-tungsten film to form a resistor-conductor system.

7. A method of forming a resistor-conductor system according to claim 6 wherein said β-tungsten is etched with a solution of hydrogen peroxide.

8. A method of forming a resistor-conductor system according to claim 7 wherein said conductive film is a metal selected from the group consisting of copper, nickel and tin and said conductive film is etched with a solution of ferric chloride.

9. A method of forming a resistor-conductor system according to claim 7 wherein said conductive film is aluminum and said conductive film is etched in a solution of 75% phosphoric acid, 15% acetic acid, 5% nitric acid and 5% water.

10. A method of forming a resistor-conductor system according to claim 8 wherein said conductive film is copper and further including removing said masking from said etched resistor-conductor system, completely coating said system with flux and dipping said system in a solder bath to coat only said etched conductive film.

11. A method of forming a resistor-conductor system according to claim 10 including positioning a semiconductor chip upon said substrate, the contact pads of said semiconductor chip being in registration with said solder coated conductive film, heating said solder to the melting point of said solder and cooling said solder to bond said semiconductor chip to said resistor-conductor system.

References Cited

UNITED STATES PATENTS

| | | | |
|---|---|---|---|
| 2,662,957 | 12/1953 | Eisler | 317—101 X |
| 2,904,452 | 9/1959 | Reichelt | 117—119 X |
| 3,061,911 | 11/1962 | Baker | 338—309 X |
| 3,217,209 | 11/1965 | Kinsella et al. | 156—3 X |
| 3,256,588 | 6/1966 | Sinkina et al. | 338—309 X |
| 3,301,707 | 1/1967 | Loeb et al. | 117—106 X |
| 3,367,806 | 2/1968 | Cullis | 156—3 X |
| 3,423,260 | 1/1969 | Heath et al. | 156—3 |

OTHER REFERENCES

Rieck: "Tungsten and Its Compounds," 1967, Pergamon Press, note particularly pp. 11, 99.

HAROLD ANSHER, Primary Examiner

J. C. GIL, Assistant Examiner

U.S. Cl. X.R.

29—195, 577; 117—119, 212, 217, 227; 156—3; 252—79.1; 338—309